United States Patent
Park (10) Patent No.: US 7,002,195 B2
(45) Date of Patent: Feb. 21, 2006

(54) MAGNETIC RANDOM ACCESS MEMORY (MRAM) CELLS HAVING SPLIT SUB-DIGIT LINES

(75) Inventor: Jae-Hyun Park, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 87 days.

(21) Appl. No.: 10/689,426

(22) Filed: Oct. 20, 2003

(65) Prior Publication Data

US 2004/0227172 A1 Nov. 18, 2004

(30) Foreign Application Priority Data

May 13, 2003 (KR) .................. 10-2003-0030353

(51) Int. Cl.
*H01L 29/76* (2006.01)

(52) U.S. Cl. .............. 257/295; 257/298; 257/303; 257/306; 257/324; 257/421; 438/3; 438/240; 365/97; 365/158

(58) Field of Classification Search ............... 257/68, 257/71, 295–314, 324–326; 438/3, 240
See application file for complete search history.

(56) References Cited

U.S. PATENT DOCUMENTS

| 6,174,737 B1 * | 1/2001 | Durlam et al. ............... 438/3 |
| 6,560,135 B1 * | 5/2003 | Matsuoka et al. ........... 365/97 |
| 6,890,770 B1 * | 5/2005 | Grynkewich et al. ......... 438/3 |
| 2002/0036917 A1 * | 3/2002 | Nishimura et al. ........ 365/158 |
| 2003/0117835 A1 * | 6/2003 | Kim et al. ................. 365/158 |

FOREIGN PATENT DOCUMENTS

JP 2002-176150 A 6/2002

* cited by examiner

*Primary Examiner*—Andy Huynh
(74) *Attorney, Agent, or Firm*—Myers Bigel Sibley & Sajovec

(57) ABSTRACT

Magnetic random access memory cells having split sub-digit lines include a pair of sub-digit lines disposed over a semiconductor substrate. The pair of sub-digit lines are spaced apart from each other when viewed from a top plan view. A magnetic resistor is disposed over the pair of sub-digit lines. The magnetic resistor is disposed to overlap with the pair of sub-digit lines. The magnetic resistor is electrically connected to a predetermined region of the semiconductor substrate through a magnetic resistor contact hole that penetrates a gap region between the pair of sub-digit lines.

29 Claims, 8 Drawing Sheets

MAGNETIC RANDOM ACCESS MEMORY (MRAM) CELLS HAVING SPLIT SUB-DIGIT LINES

RELATED APPLICATION

This application claims the benefit of Korean Patent Application No. 2003-0030353, filed May 13, 2003, the disclosure of which is hereby incorporated herein by reference in its entirety as if set forth fully herein.

FIELD OF THE INVENTION

This invention relates to integrated circuit memory devices and operating methods thereof, and more particularly to Magnetic Random Access Memory Cells (MRAM) and operating methods thereof.

BACKGROUND OF THE INVENTION

MRAM devices have been widely used as non-volatile memory devices, which can be operated at a low voltage and/or a high speed. In a unit cell of the MRAM devices, one bit of data is stored in a Magnetic Tunnel Junction (MTJ) of a magnetic resistor. The MTJ generally includes first and second ferromagnetic layers and a tunneling insulation layer interposed between the first and second ferromagnetic layers. Magnetic polarization of the first ferromagnetic layer, which is also referred to as a free layer, can be changed by a magnetic field that crosses the MTJ. The magnetic field can be induced by a current that flows around the MTJ. The magnetic polarization of the free layer may be parallel or anti-parallel to the magnetic polarization of the second ferromagnetic layer, also referred to as a pinned layer. Current for generating the magnetic field passes through a conductive layer, which is referred to as a digit line.

According to spintronics based on quantum mechanics, in the event that magnetic spins in the free layer and the pinned layer are arrayed to be parallel to each other, a tunneling current passing through the MTJ exhibits a maximum value. On the other hand, in the event that the magnetic spins in the free layer and the pinned layer are arrayed to be anti-parallel to each other, the tunneling current passing through the MTJ has a minimum value. Thus, data of the MRAM cell can be determined according to the direction of the magnetic spins in the free layer.

Figure 1:
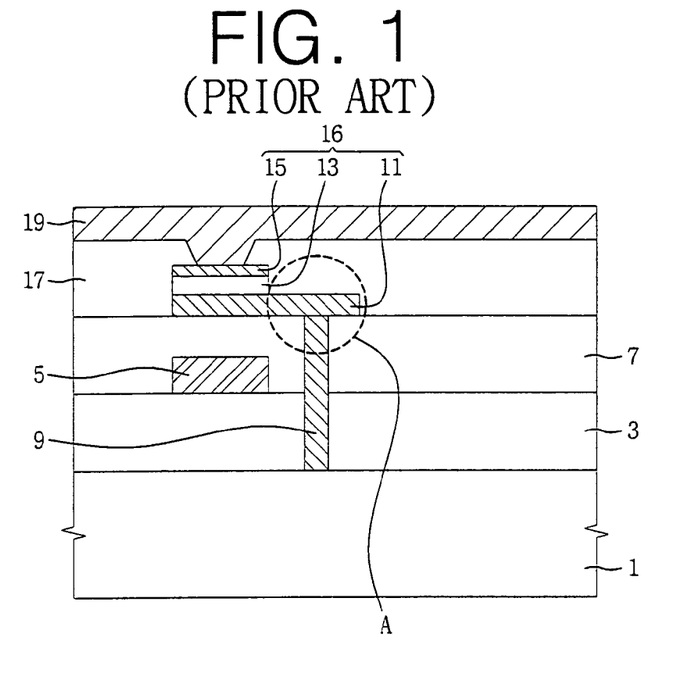
FIG. 1 is a cross-sectional view illustrating a conventional MRAM cell.

FIG. 1 is a cross-sectional view illustrating a conventional MRAM cell.

Referring to FIG. 1, a first interlayer insulating layer 3 is formed on a semiconductor substrate 1. A digit line 5 is disposed on the first interlayer insulating layer 3. The digit line 5 and the first interlayer insulating layer 3 are covered with a second interlayer insulating layer 7. A magnetic resistor 16 is disposed on the second interlayer insulating layer 7 to overlap with a predetermined region of the digit line 5. The magnetic resistor 16 includes a lower electrode 11, an MTJ 13 and an upper electrode 15 which are sequentially stacked. The magnetic resistor 16 and the second interlayer insulating layer 7 are covered with a third interlayer insulating layer 17. A bit line 19, electrically connected to the upper electrode 15, is disposed on the third interlayer insulating layer 17.

The lower electrode 11 may be electrically connected to a predetermined region of the semiconductor substrate 1. Therefore, the lower electrode 11 may be formed to have a wider width than the digit line 5. That is to say, the lower electrode 11 may have an extension A that does not overlap with the digit line 5. The extension A is electrically connected to a predetermined region of the semiconductor substrate 1 through a lower electrode plug 9 that penetrates the first and second interlayer insulating layers 3 and 7.

An MRAM cell using a vertical magnetic filed is described in U.S. Patent Application Publication No. US 2002/0036917 A1 to Nishimura et al., entitled *Nonvolatile Solid-State Memory Devices and Memory Using Magnetoresistive Effect, and Recording/Reproducing Method of the Memory Device and Memory*, published Mar. 28, 2002. As described in the abstract of this published patent application, a memory device is characterized by including a magnetoresistive element, a bit line formed above this magnetoresistive element, and a write line. The magnetoresistive element is formed immediately above the drain region of a field effect transistor.

Figure 2:
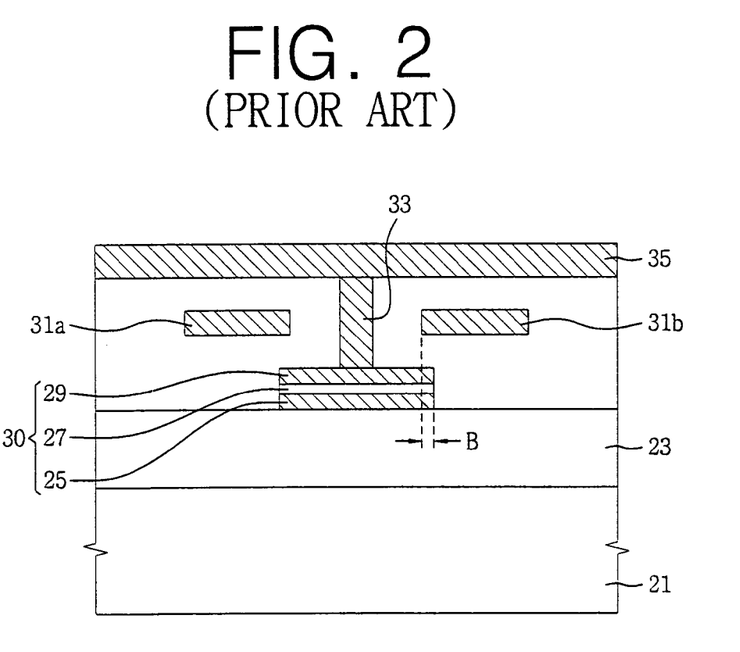
FIGS. 2 and 3 are cross-sectional views illustrating other conventional MRAM cells.
Figure 3:
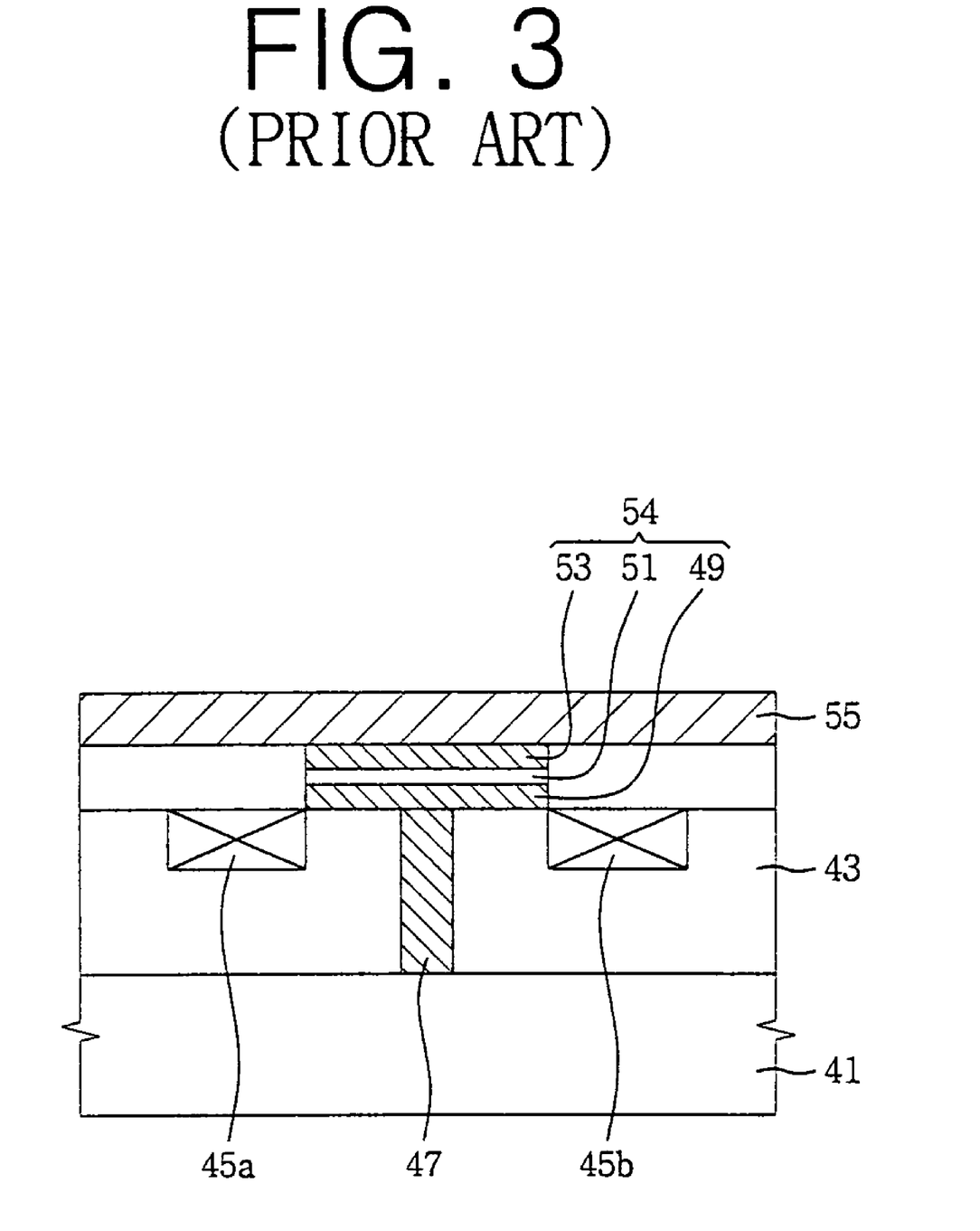

FIGS. 2 and 3 are cross-sectional views illustrating MRAM cells disclosed in U.S. Patent Application Publication No. US 2002/0036917 A1.

Referring to FIG. 2, a lower interlayer insulating layer 23 is stacked on a semiconductor substrate 21. A magnetic resistor 30 is disposed on the lower interlayer insulating layer 23. The magnetic resistor 30 includes a lower electrode 25, an MTJ 27 and an upper electrode 29 which are sequentially stacked. In addition, the magnetic resistor 30 includes ferromagnetic layers having magnetic spins arrayed in the vertical direction. First and second digit lines 31a and 31b are disposed on both ends of the magnetic resistor 30. A bit line 35 is disposed to cross over the digit lines 31a and 31b. The bit line 35 is electrically connected to the upper electrode 29 through a bit line contact plug 33 that penetrates a predetermined region between the first and second digit lines 31a and 31b.

A vertical magnetic field is used to magnetize the ferromagnetic layers of the magnetic resistor 30. The vertical magnetic field can be induced by a current that passes through the digit lines 31a and 31b. In this case, the current passing through the first digit line 31a should be anti-parallel to the current passing through the second digit line 31b. In addition, an overlap width B between the digit lines 31a and 31b and the magnetic resistor 30 may be reduced in order to improve magnetization efficiency of the magnetic resistor 30.

Referring to FIG. 3, an interlayer insulating layer 43 is stacked on a semiconductor substrate 41. A pair of digit lines 45a and 45b is disposed in the interlayer insulating layer 43. A magnetic resistor 54 is disposed on the interlayer insulating layer 43 between the digit lines 45a and 45b. The magnetic resistor 54 includes a lower electrode 49, an MTJ 51 and an upper electrode 53 which are sequentially stacked. The lower electrode 49 is electrically connected to a predetermined region of the semiconductor substrate 41 through a lower electrode contact plug 47 that penetrates the interlayer insulating layer 43 between the digit lines 45a and 45b. In addition, the upper electrode 53 is electrically connected to a bit line 55 that crosses over the magnetic resistor 54. The MRAM cell shown in FIG. 3 also employs ferromagnetic layers having magnetic spins, which are arrayed in the vertical direction.

SUMMARY OF THE INVENTION

Embodiments of the present invention provide an MRAM cell that comprises an MRAM substrate, a magnetic resistor on the MRAM substrate and first and second digit lines (also referred to herein as sub-digit lines) between the magnetic resistor and the MRAM substrate, and extending beneath the magnetic resistor. In some embodiments, a magnetic resistor contact plug electrically contacts the magnetic resistor and extends from the magnetic resistors towards the MRAM substrate, between the first and second digit lines. In other embodiments, first and second sidewall spacers are provided, a respective one of which is on a sidewall of the respective first and second digit lines and face one another, wherein the magnetic resistor contact plug extends between the first and second sidewall spacers.

In other embodiments, the first and second digit lines merge into a single digit line beyond the magnetic resistor. In still other embodiments, the first and second digit lines are connected in parallel. In yet other embodiments, the magnetic resistor is an elongated magnetic resistor having a length that is greater than a width thereof, and the magnetic resistor extends across the first and second digit lines along the length thereof. In yet other embodiments, the MRAM cell comprises a merged digit line between the magnetic resistor and the MRAM substrate, extending beneath the magnetic resistor and including therein a hole beneath the magnetic resistor that defines the first and second digit lines beneath the magnetic resistor.

According to other embodiments of the invention, an MRAM cell has split sub-digit lines. The MRAM cell includes first and second sub-digit lines disposed over a semiconductor substrate and a magnetic resistor disposed over the first and second sub-digit lines. The first and second sub-digit lines are separated from each other when viewed from a top plan view. In addition, the magnetic resistor is disposed to overlap with the first and second sub-digit lines. The magnetic resistor is electrically connected to a predetermined region of the semiconductor substrate via a magnetic resistor contact hole that passes through (penetrates) a gap region between the first and second sub-digit lines.

In some embodiments, the first and second sub-digit lines may extend parallel to each other. In some embodiments, a current passing through the first sub-digit line is parallel to a current passing through the second sub-digit line.

In other embodiments, the first and second sub-digit lines may be parallel to each other and be in contact with each other in a region beyond the magnetic resistor to form a merged digit line. The merged digit line may have an opening located beneath the magnetic resistor, and the magnetic resistor contact hole passes through the opening.

In other embodiments, the MRAM cell includes an access MOS transistor at a predetermined region of a semiconductor substrate. First and second sub-digit lines are disposed over the access MOS transistor. The first and second sub-digit lines are disposed to be parallel to each other when viewed from a top plan view. A magnetic resistor is located over the first and second sub-digit lines. Accordingly, the magnetic resistor overlaps with the first and second sub-digit lines. In addition, the magnetic resistor is electrically connected to a drain region of the access MOS transistor via a magnetic resistor contact hole passing through a gap region between the first and second sub-digit lines. A bit line is disposed over the magnetic resistor. The bit line is electrically connected to the magnetic resistor. In addition, the bit line is disposed to cross over the first and second sub-digit lines.

In other embodiments, the MRAM cell includes an access MOS transistor at a predetermined region of a semiconductor substrate. A merged digit line is disposed over the access MOS transistor. The merged digit line has an opening in a predetermined region thereof, to define partially-split first and second sub-digit lines that are located at opposite sides of the opening. A magnetic resistor is disposed over the opening. The magnetic resistor overlaps with the first and second sub-digit lines. The magnetic resistor is electrically connected to a drain region of the access MOS transistor via a magnetic resistor contact hole passing through the opening. A bit line is disposed over the magnetic resistor, and the bit line is electrically connected to the magnetic resistor. In addition, the bit line is disposed to cross over the merged digit line.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element is referred to as being "connected" or "coupled" to another element, it can be directly connected or coupled to the other element or intervening elements may be present. It also will be understood that when an element such as a layer, region or substrate is referred to as being "on" another element, it can be directly on the other element or intervening elements may also be present. Furthermore, relative terms such as "beneath", "bottom" or "outer" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

Figure 4:
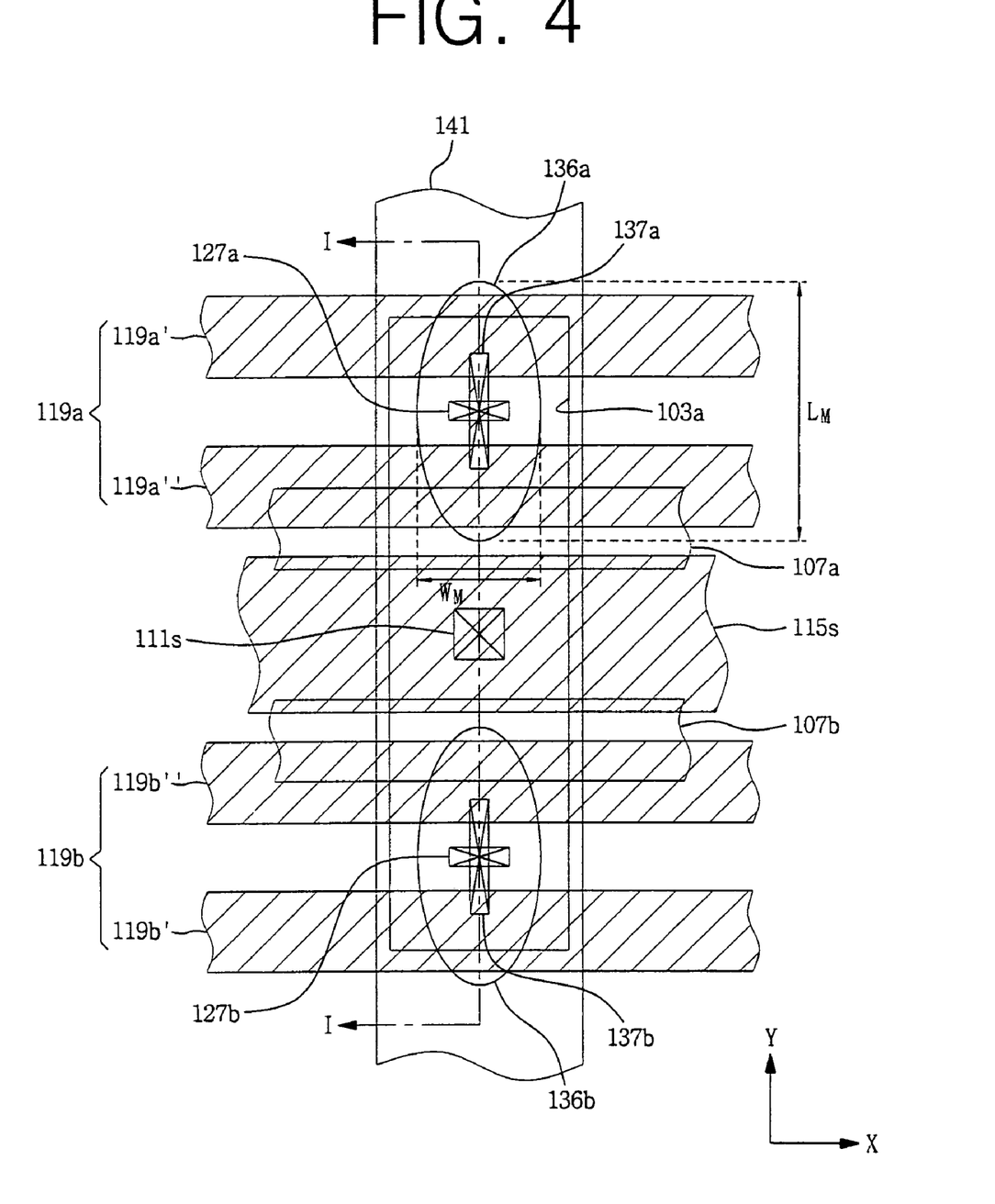
FIG. 4 is a top plan view illustrating a pair of MRAM cells in accordance with embodiments of the present invention.

FIG. 4 is a top plan view illustrating a pair of MRAM cells in accordance with embodiments of the present invention.

Referring to FIG. 4, an active region 103a is disposed at a predetermined region of an MRAM substrate such as a semiconductor substrate (not shown in FIG. 4). First and second parallel word lines 107a and 107b are disposed to cross the active region 103a. First and second access MOS transistors, which are serially connected, are disposed at the active region 103a. The active region 103a between the first and second word lines 107a and 107b corresponds to a common source region shared by the first and second access MOS transistors. The active region 103a adjacent to the first word line 107a and opposite to the common source region corresponds to a drain region of the first access MOS transistor, and the active region 103a adjacent to the second-word line 107b and opposite to the common source region corresponds to a drain region of the second access MOS transistor.

The common source region is exposed by a common source line contact hole 111s. The common source line contact hole 111s is covered with a common source line 115s crossing over the active region 103a. The common source line 115s is electrically connected to the common source region through the common source line contact hole 111s.

First and second digit lines 119a and 119b are disposed over the first and second access MOS transistors, respectively. The first digit line 119a includes a pair of parallel digit lines, referred to herein as sub-digit lines, 119a' and 119a". Similarly, the second digit line 119b includes a pair of parallel digit lines, referred to herein as sub-digit lines, 119b' and 119b". The sub-digit lines 119a', 119a", 119b' and 119b" are extended to be parallel to the common source line 115s. A current flowing in the first sub-digit line 119a' has the same direction as a current flowing in the second sub-digit line 119a". In addition, a current flowing in the first sub-digit line 119b' has the same direction as a current flowing in the second sub-digit line 119b". Stated differently, the first and second sub-digit lines are electrically connected in parallel. For example, when the current applied to the first sub-digit line 119a' flows in the positive x-axis direction, the current applied to the second sub-digit line 119a" also flows in the positive x-axis direction. In this case, horizontal magnetic field elements induced on the top surfaces of the first and second sub-digit lines 119a' and 119a" are distributed in the negative y-axis direction.

First and second magnetic resistors 136a and 136b are located over the first and second digit lines 119a and 119b, respectively. As a result, the first and second magnetic resistors 136a and 136b are disposed to overlap with the first and second digit lines 119a and 119b, respectively. Each of the first and second magnetic resistors 136a and 136b includes a lower electrode, an MTJ and an upper electrode, which are sequentially stacked. The MTJ includes a pinning layer, a pinned layer, a tunneling layer and a free layer, which are sequentially stacked. In some embodiments, the pinned layer and the free layer are ferromagnetic layers that may be different from rare earth metal described in the aforementioned U.S. Patent Application Publication No. US 2002/0036917 A1. In other words, an MRAM cell according to some embodiments of the invention employs ferromagnetic layers having magnetic spins, which are arrayed in the horizontal direction. This is because the present invention can use a horizontal magnetic field.

The first magnetic resistor 136a is electrically connected to the drain region of the first access MOS transistor through a first magnetic resistor contact hole 127a that penetrates a gap region between the first and second sub-digit lines 119a' and 119a" constituting the first digit line 119a. Similarly, the second magnetic resistor 136b is electrically connected to the drain region of the second access MOS transistor through a second magnetic resistor contact hole 127b that penetrates a gap region between the first and second sub-digit lines 119b' and 119b" constituting the second digit line 119b.

Still referring to FIG. 4, each of the magnetic resistors 136a and 136b has a length $L_M$ and a width $W_M$ less than the length $L_M$, when viewed from a top plan view. In some embodiments, the magnetic resistors 136a and 136b are disposed to cross over the first and second digit lines 119a and 119b, along the length line, as shown in FIG. 4. In this case, in some embodiments of the invention, it is possible to reduce a gap between the cells arrayed in a straight line parallel to the x-axis and increase a process margin for patterning the sub-digit lines 119a', 119a", 119b' and 119b". As a result, it is possible to realize compact MRAM cells without the need to use complicated manufacturing processes, according to some embodiments of the invention.

A bit line 141 is located over the first and second magnetic resistors 136a and 136b. The bit line 141 is disposed to cross over the digit lines 119a and 119b. The bit line 141 is electrically connected to the first and second magnetic resistors 136a and 136b through first and second bit line contact holes 137a and 137b.

Accordingly, FIG. 4 illustrates embodiments of the present invention wherein an MRAM cell comprises an MRAM substrate, a magnetic resistor 136a and/or 136b on the MRAM substrate, and first and second digit lines 119a', 119a" and/or 119b', 119b" between the magnetic resistor 136a and/or 136b and the MRAM substrate, and extending beneath the magnetic resistor 136a and/or 136b.

Figure 5:
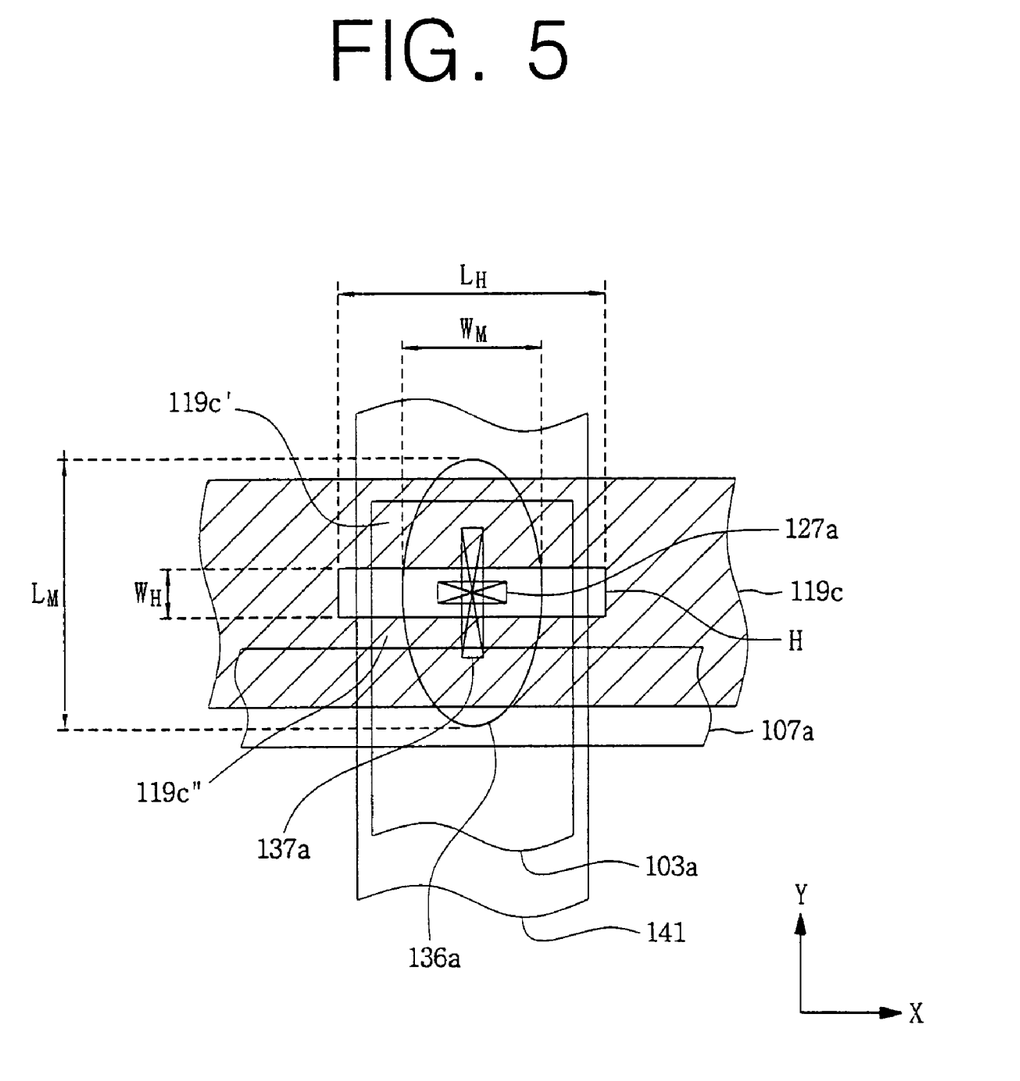
FIG. 5 is a top plan view illustrating an MRAM cell in accordance with other embodiments of the present invention.

FIG. 5 is a top plan view illustrating an MRAM cell in accordance with other embodiments of the present invention. These embodiments are different from the embodiments shown in FIG. 4 in a configuration of a digit line.

Referring to FIG. 5, a first access MOS transistor is disposed at an MRAM substrate such as a semiconductor substrate (not shown in FIG. 5). The first access MOS transistor can have the same structure as shown in FIG. 4. A first merged digit line 119c is disposed over the first access MOS transistor. The first merged digit line 119c has an opening H that penetrates a predetermined region thereof. The opening H is located over the first access MOS transistor. As a result, the first merged digit line 119c includes a pair of sub-digit lines 119c', 119c" disposed at opposite sides of the opening H. However, the pair of sub-digit lines are in contact with each other at regions between the adjacent cells, arrayed in a straight line which is parallel to the x-axis, as shown in FIG. 5.

The opening H may have a length $L_H$ and a width $W_H$ less than the length $L_H$. In some embodiments, the length $L_H$ of the opening H is parallel to the merged digit line 119c. A first magnetic resistor 136a is disposed over the merged digit line 119c as shown in FIG. 5. The opening H is covered with the first magnetic resistor 136a. The first magnetic resistor 136a may have a length $L_M$ and a width $W_M$ as described in the embodiments shown in FIG. 4. In some embodiments, the first magnetic resistor 136a is disposed to cross over the merged digit line 119c along the length $L_H$ thereof, as depicted in FIG. 5. In addition, the width $W_M$ of the first magnetic resistor 136a is smaller than the length $L_H$ of the opening H in some embodiments. This can reduce or prevent influences of a magnetic field (such as a magnetic field non-parallel to the y-axis) induced by a current flowing in the merged digit line 119c adjacent to both ends of the opening H.

The first magnetic resistor 136a is electrically connected to the drain region of the first access MOS transistor through a first magnetic resistor contact hole 127a that penetrates the opening H, and in some embodiments, penetrates the central portion of the opening.

Accordingly, FIG. 5 illustrates embodiments of the present invention wherein the first and second digit lines 119c', 119c", respectively, merge into a single digit line 119c beyond the magnetic resistor 136a. Stated differently, FIG. 5 illustrates an embodiment of a merged digit line 119c between the magnetic resistor 136a and the MRAM substrate, extending beneath the magnetic resistor 136a and including therein a hole H beneath the magnetic resistor 136a that defines the first and second digit lines 119c', 119c", respectively, beneath the magnetic resistor 136a.

The present invention may be modified from the above-described embodiments shown in FIGS. 4 and 5. For example, the first digit line 119a or 119c can be located over the first magnetic resistor 136a. In this case, the bit line 141 may be electrically connected to the first magnetic resistor 136a through a bit line contact hole that penetrates the gap region between the pair of sub-digit lines (119a' and 119a" of FIG. 4) or penetrates the opening H of the first digit line 119c.

Methods for manufacturing MRAM cells in accordance with exemplary embodiments of the present invention will now be described with reference to FIGS. 6 to 9. FIGS. 6 to 9 are cross-sectional views taken along a line I—I of FIG. 4.

Figure 6:
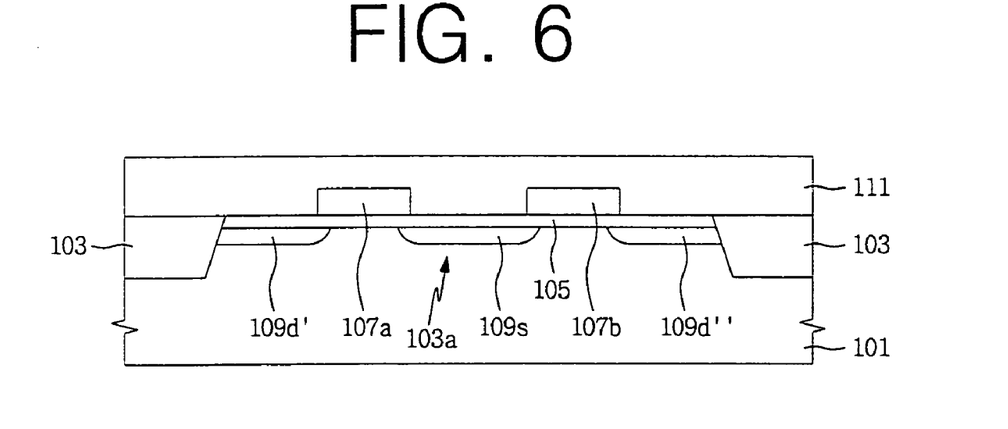
FIGS. 6 to 9 are cross-sectional views illustrating methods of manufacturing an MRAM cell in accordance with embodiments of the present invention.

Referring to FIGS. 4 and 6, an isolation layer 103 is formed at a predetermined region of an MRAM substrate such as a semiconductor substrate 101 to define an active region 103a. A gate insulating layer 105 is formed on the active region 103a. A gate conductive layer is formed on the surface of the semiconductor substrate having the gate insulating layer 105. The gate conductive layer is patterned to form a pair of parallel gate electrodes, which define first and second word lines 107a and 107b crossing over the active region 103a.

Subsequently, source/drain regions are formed at the active region 103a using, for example, a conventional ion implantation technique. As a result, a common source region 109s is formed at the active region 103a between the first and second word lines 107a and 107b. In addition, a first drain region 109d' is formed at the active region 103a which is adjacent to the first word line 107a and located opposite to the common source region 109s, and a second drain region 109d" is formed at the active region 103a which is adjacent to the second word line 107b and located opposite to the common source region 109s. The first word line 107a, the first drain region 109d' and the common source region 109s constitute a first access MOS transistor. Similarly, the second word line 107b, the second drain region 109d" and the common source region 109s constitute a second access MOS transistor. A first interlayer insulating layer 111 is formed on the surface of the semiconductor substrate having the first and second access MOS transistors.

Figure 7:
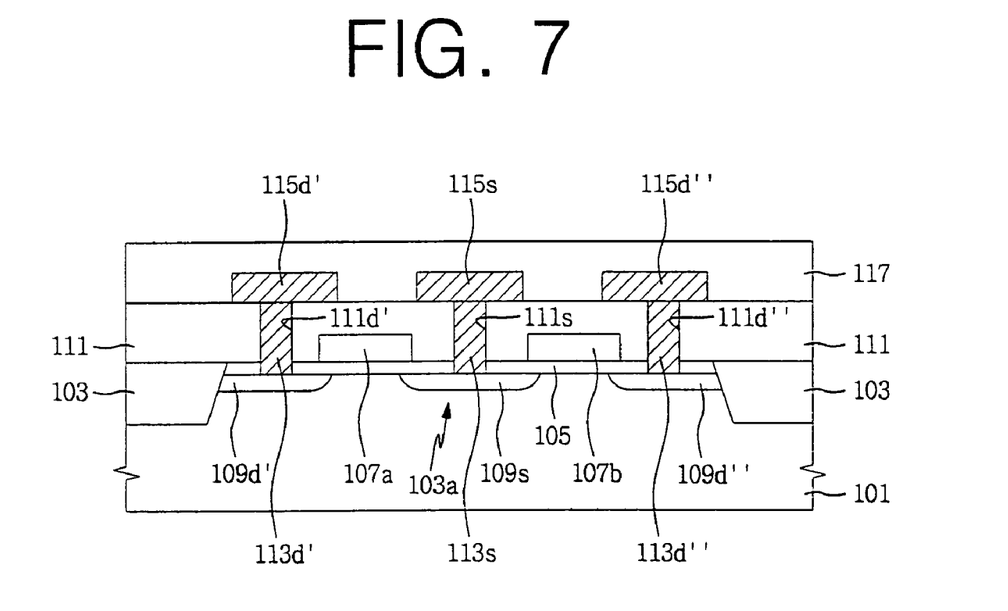

Referring to FIGS. 4 and 7, the first interlayer insulating layer 111 and the gate insulating layer 105 are patterned to form first and second drain pad contact holes 111d' and 111d" as well as a common source line contact hole 111s. The first and second drain pad contact holes 111d' and 111d" are formed to expose the first and second drain regions 109d' and 109d", respectively. In addition, the common source line contact hole 111s is formed to expose the common source region 109s. A first drain pad contact plug 113d', a second drain pad contact plug 113d" and a common source line contact plug 113s are formed in the first drain pad contact hole 111d', the second drain pad contact hole 111d" and the common source line contact hole 111s in a conventional manner.

A conductive layer is formed on the surface of the semiconductor substrate having the contact plugs 113s, 113d' and 113d". The conductive layer is patterned to form first and second drain pads 115d' and 115d" as well as a common source line 115s. The first and second drain pads 115d' and 115d" are formed to cover the first and second drain pad contact plugs 113d' and 113d" respectively, and the common source line 115s is formed to cover the common source line contact plug 113s. The common source line 115s is formed to cross over the active region 103a. A second interlayer insulating layer 117 is formed on the surface of the semiconductor substrate including the first and second drain pads 115d' and 115d" as well as the common source line 115s.

Figure 8:
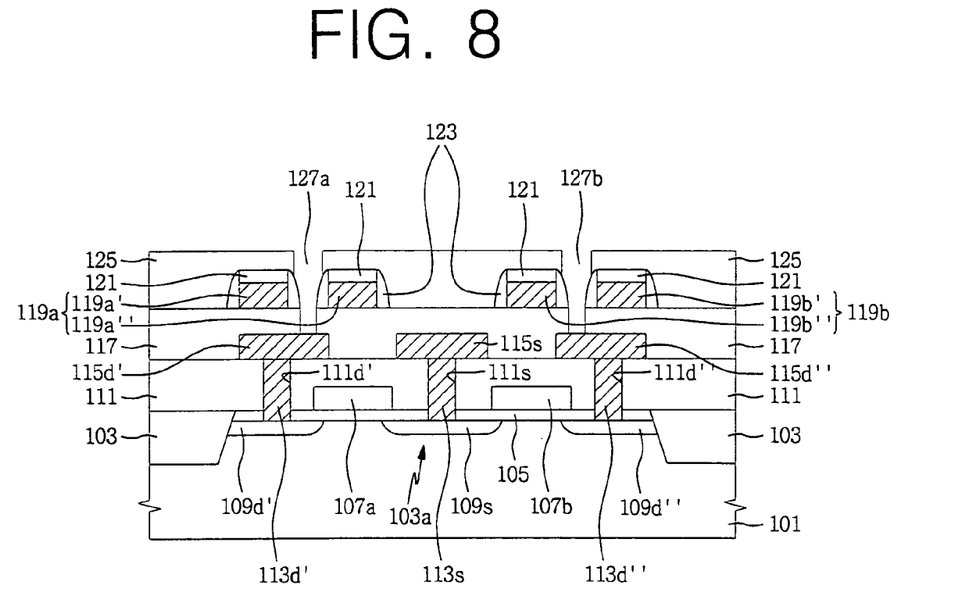

Referring to FIGS. 4 and 8, a conductive layer is formed on the second interlayer insulating layer 117. The conductive layer is patterned to form first and second digit lines 119a and 119b that cross over the first and second access MOS transistors. Each of the first and second digit lines 119a and 119b includes a pair of parallel sub-digit lines as shown in FIGS. 4 and 8. In detail, the first digit line 119a is formed to have first and second parallel sub-digit lines 119a' and 119a", and the second digit line 119b is formed to have first and second parallel sub-digit lines 119b' and 119b". The sub-digit lines 119a', 119a", 119b' and 119b" are formed to be parallel to the word lines 107a and 107b.

Further, capping layer patterns 121 may be stacked on the first and second digit lines 119a and 119b. In this case, the capping layer patterns 121 may comprise an insulating layer having an etching selectivity with respect to a silicon oxide layer used as a conventional interlayer insulating layer. For example, the capping layer patterns 112 may be formed of a silicon nitride or a silicon oxynitride (SiON) layer. The digit lines 119a and 119b and the capping layer patterns 121 thereon constitute digit line patterns. In some embodiments, spacers 123 are formed on sidewalls of the digit line patterns in a conventional manner. Also, the spacers 123 may be formed of an insulating layer having an etching selectivity with respect to a silicon oxide layer used as a conventional interlayer insulating layer. That is, the spacers 123 may be formed of a silicon nitride layer or a silicon oxynitride (SiON) layer. In the event that the process for forming the capping layer patterns 121 is omitted, the spacers 123 may be formed on the sidewalls of the digit lines 119a and 119b, namely the sub-digit lines 119a', 119a", 119b' and 119b".

A third interlayer insulating layer 125 is formed on the surface of the semiconductor substrate having the digit line patterns and the spacers 123. The third and second interlayer insulating layers 125 and 117 are patterned to form a first magnetic resistor contact hole 127a exposing the first drain pad 115d' and a second magnetic resistor contact hole 127b exposing the second drain pad 115d". The first magnetic resistor contact hole 127a is formed to pass through the gap region between the sub-digit lines 119a' and 119a" constituting the first digit line 119a. Similarly, the second magnetic resistor contact hole 127b is formed to pass through the gap region between the sub-digit lines 119b' and 119b" constituting the second digit line 119b. The capping layer patterns 121 and the spacers 123 can act as etch stopping layers during formation of the magnetic resistor contact holes 127a and 127b. As a result, the magnetic resistor contact holes 127a and 127b can be formed using a self-aligned contact technique.

Figure 9:
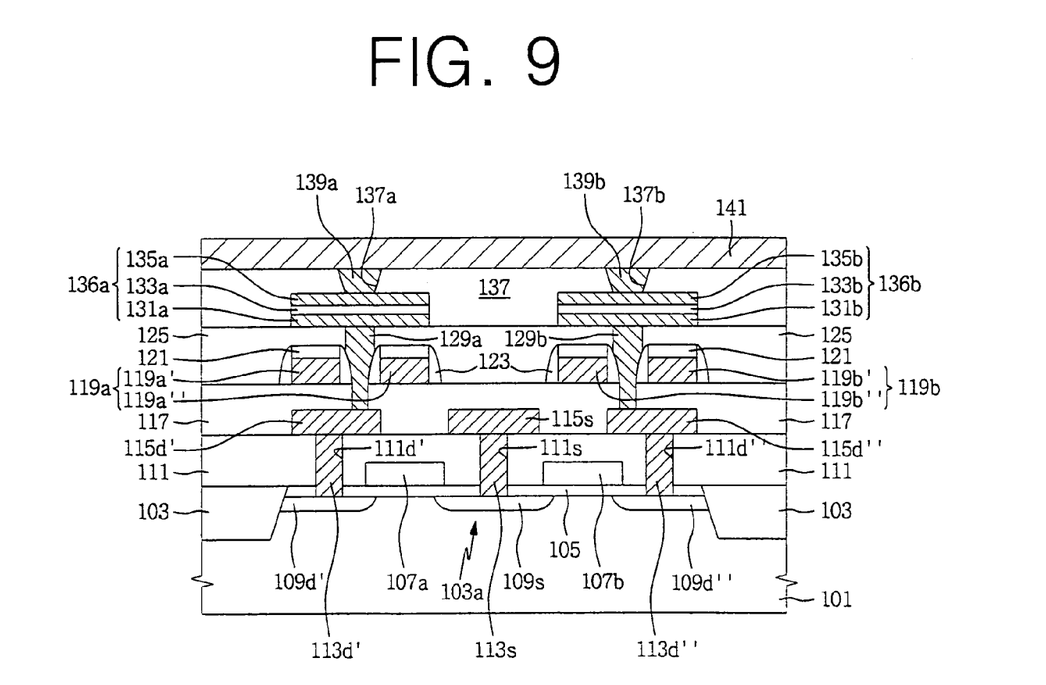

Referring to FIGS. 4 and 9, first and second magnetic resistor contact plugs 129a and 129b are formed in the first and second magnetic resistor contact holes 127a and 127b using a conventional method. A lower electrode layer, an MTJ layer and an upper electrode layer are sequentially formed on the surface of the semiconductor substrate having the magnetic resistor contact plugs 129a and 129b. The MTJ layer may be formed by sequentially stacking a pinning layer, a pinned layer, a tunneling insulation layer and a free layer. In some embodiments, the pinned layer and the free layer are formed of a ferromagnetic layer such as a CoFe layer and/or NiFe layer, and the pinning layer is formed of an anti-ferromagnetic layer such as a PtMn layer, a IrMn layer and/or a FeMn layer. Also, the tunneling insulation layer may be formed of an insulating layer such as an aluminum oxide ($Al_2O_3$) layer, a hafnium oxide (HfO) layer and/or a tantalum oxide (TaO) layer.

In some embodiments, the MTJ layer is flat. However, flatness of the MTJ layer may be directly influenced by a surface profile of the lower electrode layer. Therefore, the lower electrode layer may be planarized using a chemical mechanical polishing technique prior to formation of the MTJ layer.

The upper electrode layer, the MTJ layer and the lower electrode layer are patterned to form first and second magnetic resistors 136a and 136b covering the first and second magnetic resistor contact plugs 129a and 129b respectively. As a result, the first magnetic resistor 136a includes a first lower electrode 131a, a first MTJ 133a and a first upper electrode 135a which are sequentially stacked, and the second magnetic resistor 136b includes a second lower electrode 131b, a second MTJ 133b and a second upper electrode 135b which are sequentially stacked. The first lower electrode 131a is electrically connected to the first drain region 109d' through the first magnetic resistor contact plug 129a in the first magnetic resistor contact hole 127a, and the second lower electrode 131b is electrically connected to the second drain region 109d'' through the second magnetic resistor contact plug 129b in the second magnetic resistor contact hole 127b. The first magnetic resistor 136a is formed to overlap with the first digit line 119a, namely the first and second sub-digit lines 119a' and 119a'', and the second magnetic resistor 136b is formed to overlap with the second digit line 119b, namely the first and second sub-digit lines 119b' and 119b''. Each of the first and second magnetic resistors 136a and 136b may have a length $L_M$ and a width $W_M$ smaller than the length $L_M$, when viewed from a top plan view as shown in FIG. 4. In some embodiments, the magnetic resistors 136a and 136b are preferably formed to cross over the digit lines 119a and 119b along the length $L_M$ thereof.

A fourth interlayer insulating layer 137 is formed on the surface of the semiconductor substrate including the first and second magnetic resistors 136a and 136b. The fourth interlayer insulating layer 137 is patterned to form first and second bit line contact holes 137a and 137b that expose the first and second upper electrodes 135a and 135b, respectively. A bit line 141 is formed on the fourth interlayer insulating layer 137. The bit line 141 is formed to cover the first and second bit line contact holes 137a and 137b. Accordingly, the bit line 141 is electrically connected to the first upper electrode 135a through the first bit line contact hole 137a. Similarly, the bit line 141 is electrically connected to the second upper electrode 135b through the second bit line contact hole 137b. First and second bit line contact plugs 139a and 139b may be formed in the first and second bit line contact holes 137a and 137b prior to formation of the bit line 141.

Accordingly, FIGS. 6 to 9 illustrate an MRAM cell which includes a magnetic resistor contact plug 129a, 129b that electrically contacts the magnetic resistor 136a, 136b and extends from the magnetic resistor towards the MRAM substrate 101 between the first and second digit lines 119a', 119a''. Moreover, these figures also illustrate an MRAM cell which includes first and second sidewall spacers 123, a respective one of which is on a sidewall of the respective first and second digit lines and face one another, and wherein the magnetic resistor contact plug 129a, 129b extends between the first and second sidewall spacers.

It will be understood by those skilled in the art that the MRAM cell of FIG. 5 can be manufactured using similar methods as the embodiments described in FIGS. 6 to 9.

Figure 10A:
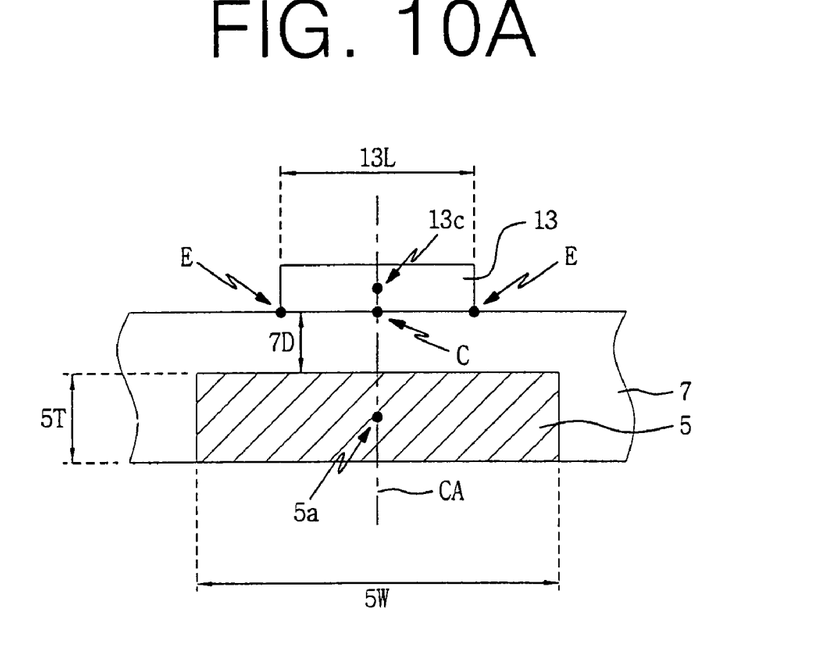
FIG. 10A is a cross-sectional view illustrating a structure used in simulation of properties of the MRAM cell shown in FIG. 1.

FIG. 10A is a cross-sectional view illustrating a structure that may be used in calculation of the magnetic field induced by the current that flows in the digit line of the conventional MRAM cell.

Referring to FIG. 10A, the digit line 5 has a width 5W and a thickness 5T, and an MTJ 13 is located over the digit line 5. The MTJ 13 has a length 13L and is disposed to cross over the digit line 5. In particular, a center point 13c of the MTJ 13 is located on a vertical axis CA passing a center point 5a of the digit line 5. The MTJ 13 is spaced apart from the top surface of the digit line 5 by a predetermined distance 7D. A region between the digit line 5 and the MTJ 13 is filled with an interlayer insulating layer 7 composed of silicon oxide. As a result, the distance 7D is identical to a thickness of the interlayer insulating layer 7 interposed between the digit line 5 and the MTJ 13.

Figure 10B:
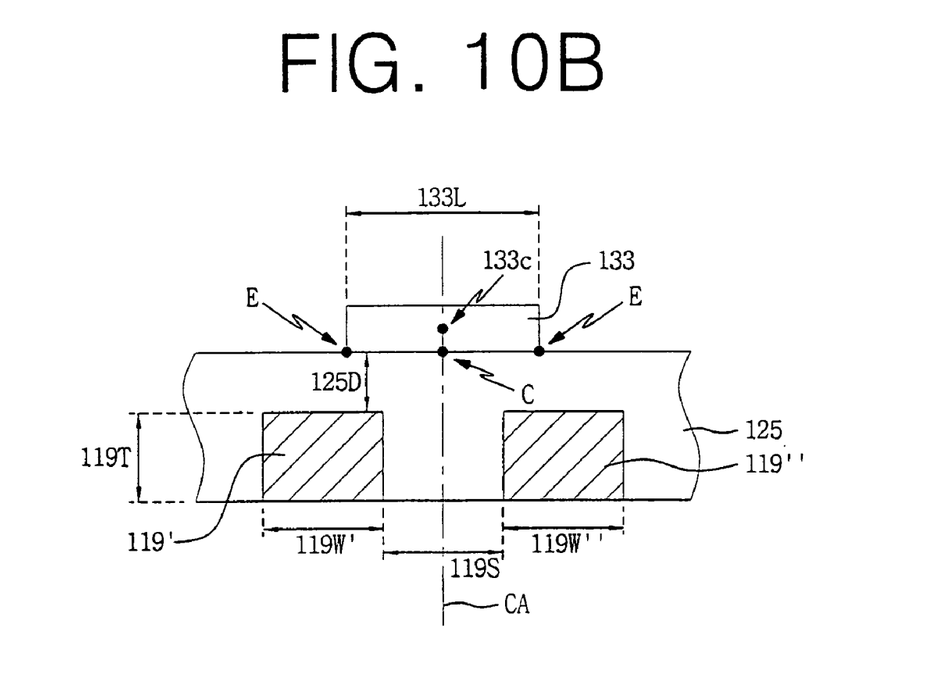
FIG. 10B is a cross-sectional view illustrating a structure used in simulation of properties of the MRAM cells in accordance with embodiments of the present invention.

FIG. 10B is a cross-sectional view illustrating a structure that may be used in calculation of the magnetic field induced by the current that flows in a pair of sub-digit lines of the MRAM cell according to some embodiments of the present invention.

Referring to FIG. 10B, the pair of sub-digit lines, namely first and second sub-digit lines 119' and 119'' have first and second widths 119W' and 119W'', respectively. In addition, the sub-digit lines 119' and 119'' have a thickness 119T. The sub-digit lines 119' and 119'' are spaced apart from each other by a distance 119S. The sub-digit lines 119' and 119'' are covered with an interlayer insulating layer 125 composed of silicon oxide. An MTJ 133 is disposed over the interlayer insulating layer 125 to overlap with the sub-digit lines 119' and 119''. In particular, a center point 133c of the MTJ 133 is located on a vertical axis CA that passes a center point of a gap region between the sub-digit lines 119' and 119''. The MTJ 133 has a length 133L and is disposed to cross over the sub-digit lines 119' and 119''. The interlayer insulating layer 125 is interposed between the sub-digit lines 119' and 119'' and the MTJ 133 has a thickness 125D. As a result, the MTJ 133 is spaced apart from the top surfaces of the sub-digit lines 119' and 119'' by the thickness 125D.

Figure 11:
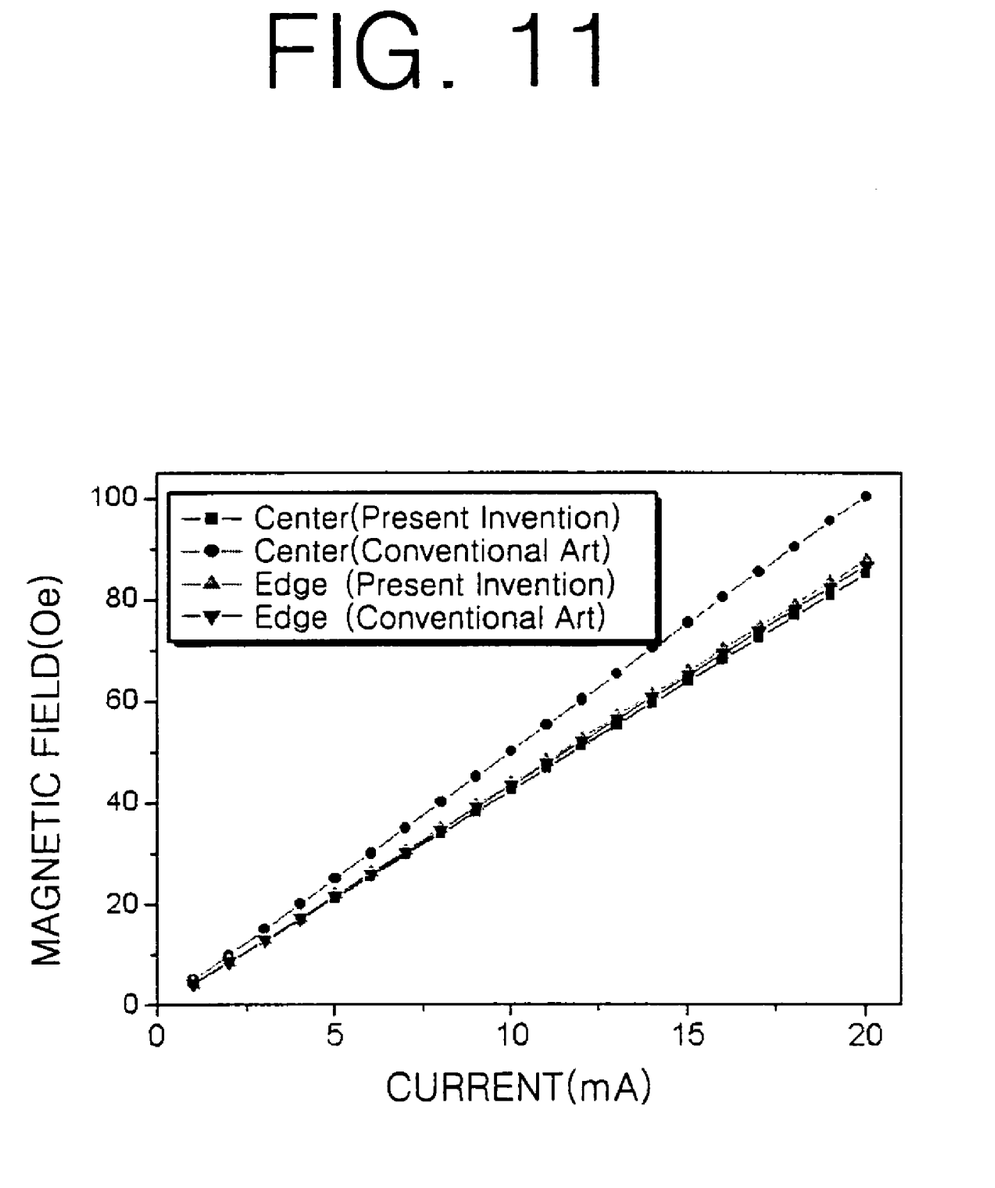
FIG. 11 is a graph showing simulation results of the properties of the MRAM cells shown in FIGS. 10A and 10B.

FIG. 11 is a graph showing simulation results of the magnetic field induced by the current that flows in the digit lines of FIGS. 10A and 10B. In this graph, the abscissa indicates a current that flows in the digit lines and the ordinate indicates magnetic fields at various positions in the magnetic resistors. In some embodiments of the present invention that are illustrated in FIG. 10B, the current is a sum of a first current flowing in the first sub-digit line 119' and a second current flowing in the second sub-digit line 119''. The first current and the second current flow in the same direction. In FIG. 11, data denoted by circles '●' correspond to magnetic fields at a center point of the bottom surface of the MTJ 13 shown in FIG. 10A, and data denoted by upside down triangles '▼' correspond to magnetic fields at an edge of the bottom surface of the MTJ 13 shown in FIG. 10A. In addition, data indicated by regular squares '■' correspond to magnetic fields at a center point C of the bottom surface of the MTJ 133 shown in FIG. 10B, and data indicated by triangles '▲' correspond to magnetic fields at an edge E of the bottom surface of the MTJ 133 shown in FIG. 10B. The data in this graph are simulated under the assumption that the interlayer insulating layers 7 and 125 of FIGS. 10A and 10B are silicon oxide layers having a dielectric constant of 3.9. In this case, dimensions of the elements shown in FIGS. 10A and 10B are summarized in the following Table.

TABLE

| | | |
|---|---|---|
| FIG. 10A | Length of magnetic resistor (13L) | 5000 Å |
| | Thickness of interlayer insulating layer (7D) | 1500 Å |
| | Thickness of digit line (5T) | 3000 Å |
| | Width of digit line (5W) | 7000 Å |
| FIG. 10B | Length of magnetic resistor (133L) | 5000 Å |
| | Thickness of interlayer insulating layer (125D) | 1500 Å |
| | Thickness of sub-digit lines (119T) | 3000 Å |
| | Width of first sub-digit line (119W') | 2500 Å |
| | Width of second sub-digit line (119W") | 2500 Å |
| | Interval between sub-digit lines (119S) | 2000 Å |

As shown in FIG. 11, the magnetic fields at the MTJ of the MRAM cell according to some embodiments the invention that are illustrated in FIG. 10B were relatively uniform regardless of the positions. On the contrary, the magnetic fields at the MTJ of a conventional MRAM cell that was illustrated in FIG. 10A were non-uniform according to the positions.

Thus, according to some embodiments of the present invention, it is possible to realize compact MRAM cells with relatively uniform magnetic fields throughout the MTJ. Thus, it is possible to increase integration densities of the MRAM devices.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A magnetic random access memory cell, comprising:
    first and second sub-digit lines disposed over a semiconductor substrate, the first and second sub-digit lines being spaced apart from each other when viewed from a top plan view; and
    a magnetic resistor disposed over the first and second sub-digit lines and overlapping with the first and second sub-digit lines, wherein the magnetic resistor is electrically connected to a predetermined region of the semiconductor substrate through a magnetic resistor contact hole that penetrates a gap region between the first and second sub-digit lines.

2. A magnetic random access memory cell according to claim 1, wherein the magnetic resistor has a length and a width smaller than the length when viewed from a top plan view, and the magnetic resistor is disposed to cross over the first and second sub-digit lines along the length thereof.

3. A magnetic random access memory cell according to claim 1, wherein the first and second sub-digit lines extend parallel to each other.

4. A magnetic random access memory cell according to claim 3, wherein a direction of a current flowing in the first sub-digit line is identical to a direction of a current flowing in the second sub-digit line.

5. A magnetic random access memory cell according to claim 1 further comprising a bit line which is disposed over the magnetic resistor and is electrically connected to the magnetic resistor, wherein the bit line is disposed to cross over the sub-digit lines.

6. A magnetic random access memory call according to claim 1, wherein the magnetic resistor comprises a magnetic tunnel junction including a pinning layer, a pinned layer, a tunneling layer and a free layer which are sequentially stacked, and the pinned layer and the free layer comprise ferromagnetic layers having magnetic spins arrayed in a horizontal direction.

7. A magnetic random access memory cell, comprising:
    first and second sub-digit lines disposed over a semiconductor substrate, the first and second sub-digit lines being spaced apart from each other when viewed from a top plan view; and
    a magnetic resistor disposed over the first and second sub-digit lines, wherein the magnetic resistor is electrically connected to a predetermined region of the semiconductor substrate through a magnetic resistor contact hole that penetrates a gap region between the first and second sub-digit lines and wherein the first and second sub-digit lines extend parallel to each other and contact each other beyond the magnetic resistor, to form a single merged digit line-having an opening beneath the magnetic resistor, and wherein the magnetic resistor contact hole penetrates the opening.

8. A magnetic random access memory cell according to claim 7, wherein the magnetic resistor has a length and a width less than the length when viewed from a top plan view, and the magnetic resistor is disposed to cross over the first and second sub-digit lines along the length thereof.

9. A magnetic random access memory cell according to claim 8, wherein the width of the magnetic resistor is less than a length of the opening parallel to the merged digit line.

10. A magnetic random access memory cell, comprising:
    an access MOS transistor at a predetermined region of a semiconductor substrate;
    first and second parallel sub-digit lines disposed over the access MOS transistor;
    a magnetic resistor disposed over the first and second sub-digit lines to overlap with the first and second sub-digit lines, the magnetic resistor being electrically connected to a drain region of the access MOS transistor through a magnetic resistor contact hole that penetrates a gap region between the first and second sub-digit lines; and
    a bit line disposed over the magnetic resistor and electrically connected to the magnetic resistor, wherein the bit line crosses over the first and second sub-digit lines.

11. A magnetic random access memory cell according to claim 10 further comprising a common source line electrically connected to a source region of the access MOS transistor, wherein the common source line extends parallel to the sub-digit lines.

12. A magnetic random access memory cell according to claim 10, wherein a direction of a current flowing in the first sub-digit line is identical to a direction of a current flowing in the second sub-digit line.

13. A magnetic random access memory cell according to claim 10 further comprising spacers and capping layers covering the sidewalls and top surfaces of the sub-digit lines respectively, wherein the magnetic resistor contact hole extends between adjacent spacers and between the capping layers.

14. A magnetic random access memory cell according to claim 10, wherein the magnetic resistor has a length and a width less than the length when viewed from a top plan view and the magnetic resistor is disposed to cross over the first and second sub-digit lines along the length thereof.

15. A magnetic random access memory cell according to claim 10, wherein the magnetic resistor comprises a magnetic tunnel junction including a pinning layer, a pinned layer, a tunneling layer and a free layer which are sequentially stacked, and the pinned layer and the free layer comprise ferromagnetic layers having magnetic spins arrayed in a horizontal direction.

16. A magnetic random access memory cell, comprising:
   an access MOS transistor at a predetermined region of a semiconductor substrate;
   a merged digit line disposed over the access MOS transistor, the merged digit line having an opening in a predetermined region thereof;
   a magnetic resistor disposed over the opening to overlap with the merged digit line, the magnetic resistor being electrically connected to a drain region of the access MOS transistor through a magnetic resistor contact hole that penetrates the opening; and
   a bit line disposed over the magnetic resistor and electrically connected to the magnetic resistor, the bit line being disposed to cross over the merged digit line.

17. A magnetic random access memory cell according to claim 16 further comprising a common source line electrically connected to a source region of the access MOS transistor, wherein the common source line extends parallel to the merged digit line.

18. A magnetic random access memory cell according to claim 16 further comprising a spacer and a capping layer covering a sidewall of the opening and a top surface of the merged digit line respectively, wherein the magnetic resistor contact hole extends inside the spacer and the capping layer.

19. A magnetic random access memory cell according to claim 16, wherein the magnetic resistor has a length and a width less than the length when viewed from a top plan view, and the magnetic resistor is disposed to cross over the merged digit line along the length thereof.

20. A magnetic random access memory cell according to claim 19, wherein a width of the magnetic resistor is less than a length of the opening parallel to the merged digit line.

21. A magnetic random access memory cell according to claim 16, wherein the magnetic resistor comprises a magnetic tunnel junction including a pinning layer, a pinned layer, a tunneling layer and a free layer which are sequentially stacked, and the pinned layer and the free layer comprise ferromagnetic layers having magnetic spins arrayed in a horizontal direction.

22. A Magnetic Random Access Memory (MRAM) cell comprising:
   an MRAM substrate;
   a magnetic resistor on the MRAM substrate; and
   first and second digit lines between the magnetic resistor and the MRAM substrate and extending beneath the magnetic resistor, wherein the magnetic resistor overlaps the first and second digit lines.

23. An MRAM cell according to claim 22, further comprising a magnetic resistor contact plug that electrically contacts the magnetic resistor and extends from the magnetic resistor towards the MRAM substrate, between the first and second digit lines.

24. An MRAM cell according to claim 23 further comprising first and second sidewall spacers, a respective one of which is on a sidewall of the respective first and second digit lines and face one another, and wherein the magnetic resistor contact plug extends between the first and second sidewall spacers.

25. An MRAM cell according to claim 23 further comprising a transistor in the MRAM substrate and electrically connected to the magnetic resistor contact plug.

26. An MRAM cell according to claim 22 wherein the magnetic resistor is an elongated magnetic resistor having a length that is greater than a width thereof, and wherein the magnetic resistor extends across the first and second digit lines along the length thereof.

27. An MRAM cell according to claim 22 wherein the first and second digit lines are electrically connected in parallel.

28. A Magnetic Random Access Memory (MRAM) cell comprising:
   an MRAM substrate;
   a magnetic resistor on the MRAM substrate; and
   first and second digit lines between the magnetic resistor and the MRAM substrate and extending beneath the magnetic resistor, wherein the first and second digit lines merge into a single digit line beyond the magnetic resistor.

29. A Magnetic Random Access Memory (MRAM) cell comprising:
   an MRAM substrate;
   a magnetic resistor on the MRAM substrate;
   first and second digit lines between the magnetic resistor and the MRAM substrate and extending beneath the magnetic resistor; and
   a merged digit line between the magnetic resistor and the MRAM substrate, extending beneath the magnetic resistor and including therein a hole beneath the magnetic resistor that defines the first and second digit lines beneath the magnetic resistor.

* * * * *